(12) United States Patent
Steinecke

(10) Patent No.: US 6,646,475 B2
(45) Date of Patent: Nov. 11, 2003

(54) ON-CHIP POWER SUPPLY WITH OPTIMIZED ELECTROMAGNETIC COMPATIBILITY

(75) Inventor: Thomas Steinecke, Hofsingelding (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/113,345

(22) Filed: Apr. 1, 2002

(65) Prior Publication Data

US 2002/0131281 A1 Sep. 19, 2002

Related U.S. Application Data

(63) Continuation of application No. PCT/EP00/09458, filed on Sep. 27, 2000.

(30) Foreign Application Priority Data

Sep. 30, 1999 (DE) .......................... 199 47 021

(51) Int. Cl.[7] .......................................... H03K 19/177
(52) U.S. Cl. ...................................... 326/101
(58) Field of Search .................. 363/144, 147; 361/764, 766, 807–810; 326/41, 47, 80, 101

(56) References Cited

U.S. PATENT DOCUMENTS

| | | | | | |
|---|---|---|---|---|---|
| 4,586,242 A | * | 5/1986 | Harrison | ...................... | 29/574 |
| 4,656,370 A | * | 4/1987 | Kanuma | ...................... | 307/303 |
| 5,272,600 A | * | 12/1993 | Carey | ...................... | 361/792 |
| 5,521,530 A | * | 5/1996 | Yao et al. | ...................... | 326/80 |
| 5,780,930 A | * | 7/1998 | Malladi et al. | ............. | 257/777 |
| 6,184,711 B1 | * | 2/2001 | Graef et al. | .................. | 326/41 |

FOREIGN PATENT DOCUMENTS

| | | |
|---|---|---|
| DE | 195 40 647 A1 | 10/1996 |
| DE | 197 00 988 A1 | 7/1997 |
| DE | 19700988 | * 7/1997 |
| DE | 197 36 197 C1 | 3/1999 |
| EP | 0 926 736 A2 | 6/1999 |
| EP | 0926736 | * 6/1999 |
| JP | 4326565 | * 11/1992 |
| JP | 04 326 565 A | 11/1992 |
| JP | 09 246 476 A | 9/1997 |
| JP | 9246476 | * 9/1997 |
| JP | 10 150 148 A | 6/1998 |
| JP | 10150148 | * 6/1998 |

* cited by examiner

*Primary Examiner*—Matthew V. Nguyen
(74) *Attorney, Agent, or Firm*—Laurence A. Greenberg; Werner H. Stemer; Gregory L. Mayback

(57) ABSTRACT

The integrated circuit is implemented on a chip. The circuit has several modules, common power supply pins for the modules, and a capacitive buffer devices that buffer the current supply. The capacitive buffers are assigned to each module.

4 Claims, 1 Drawing Sheet

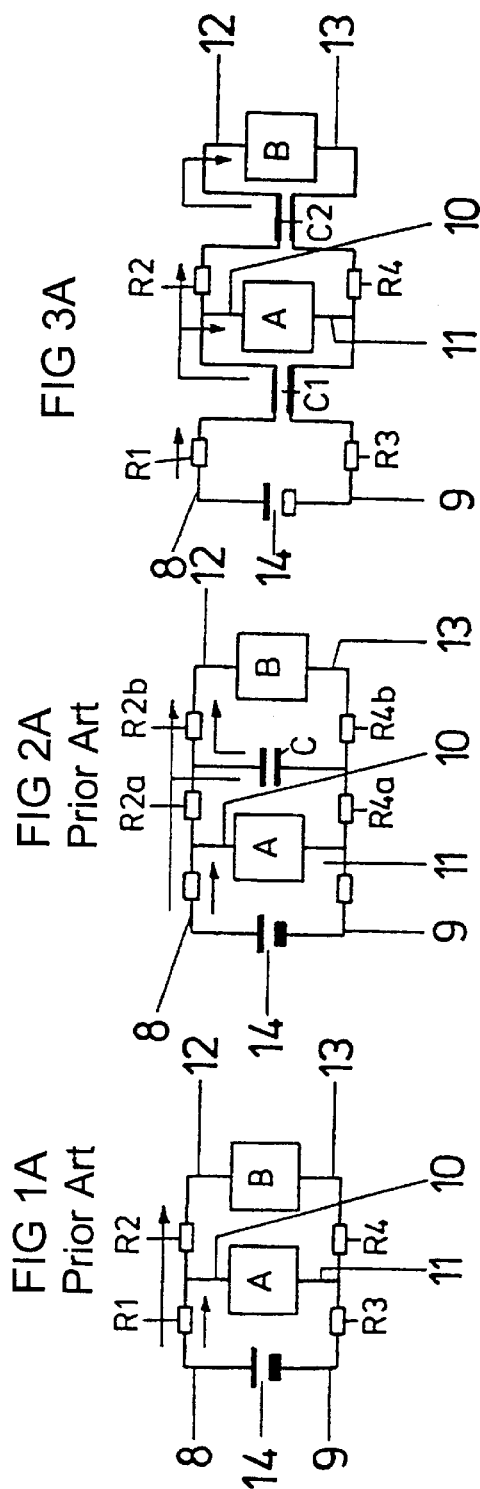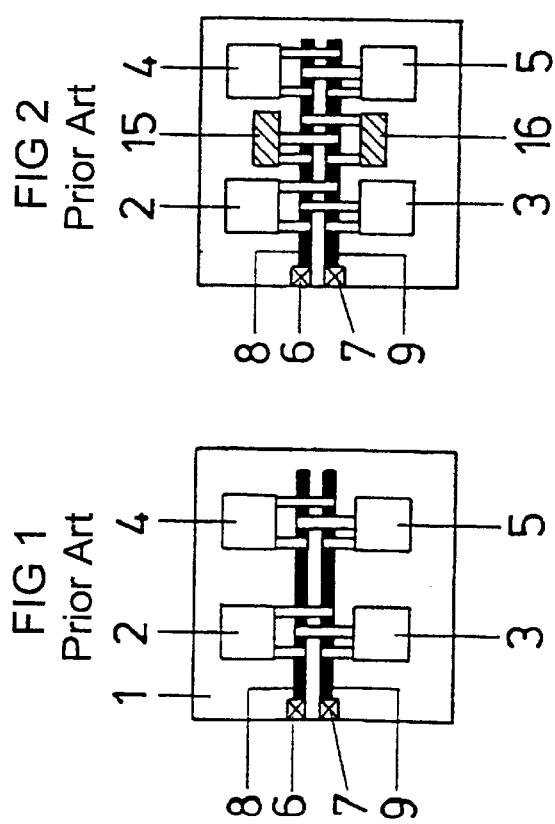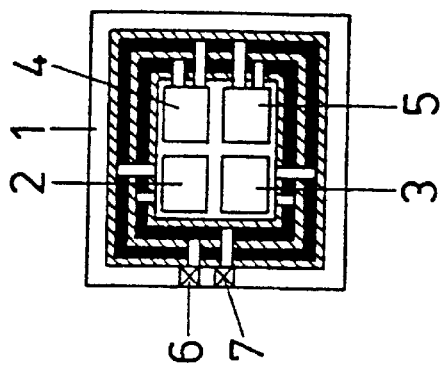

ON-CHIP POWER SUPPLY WITH OPTIMIZED ELECTROMAGNETIC COMPATIBILITY

CROSS-REFERENCE TO RELATED APPLICATION

This application is a continuation of copending International Application No. PCT/EP00/09458, filed Sep. 27, 2000, which designated the United States.

BACKGROUND OF THE INVENTION

Field of the Invention

The present invention lies in the integrated technology field. More specifically, the invention pertains to an integrated circuit which is formed on a chip and which has a plurality of modules, common power supply pins for the modules, and capacitive buffers for buffering the power supply.

Two different prior art power supply concepts for supplying power to an integrated circuit formed on a chip are shown in FIGS. 1, 1A and 2, 2A. FIG. 1 and FIG. 2 show schematic plan views of the IC and of the integrated circuit, while FIG. 1A and FIG. 2 show the respective equivalent circuit diagrams of the circuits according to FIGS. 1 and 2. In these figures, the respective dynamic current flow is shown with arrows. Dynamic current flow is to be understood as meaning that current flow for supplying the modules of the integrated circuit which corresponds to the current power demand or switching current of the modules.

A power supply concept for an integrated circuit of an earlier design which is formed on a chip and which does not have any buffers is shown in FIG. 1 and FIG. 1A. In FIG. 1, the chip is generally designated with the reference numeral 1. An integrated circuit, which comprises, by way of example, four modules 2, 3, 4 and 5 is formed on the chip 1. The power supply of these modules, which can be any desired circuits, is provided, for example, from two supply terminals 6 and 7, referred to as pins 6, 7 which can be arranged at the edge of the chip 1. The supply pins 6, 7 are connected to two supply tracks 8, 9 which are spaced apart laterally and which extend linearly and parallel to one another. The power supply terminals of the modules 2, 3, 4, 5 are each connected to the supply tracks 8, 9 via one pair or a plurality of pairs of connecting tracks. These connecting tracks run perpendicular to the supply tracks 8, 9 and are designated by the reference numerals 10 to 13 in the equivalent circuit diagram FIG. 1A.

In FIG. 1A, for the sake of simplicity, the modules 2, 3 and 4, 5 which are each at the same height with respect to supply tracks 8, 9 are represented as a uniform module A and B. The ohmic character of the supply tracks 8, 9 is represented in FIG. 1A by resistors, namely by the resistors R1, R2 and R3, R4 located on these lines. The connecting tracks (double) to the module A are designated by 10, 11 and the corresponding connecting tracks for the (double) module B are designated by 12, 13. Instead of the connecting pins 6, 9, an external d.c. source, which is designated by the reference numeral 14 and is connected to the connecting pins 6, 7, is shown in the equivalent circuit diagram according to FIG. 1A. The low-impedance configuration of the supply tracks 8, 9 and of the connecting tracks 10, 11 and 12, 13 ensures the essentially unimpeded supply of even high, necessary switching currents from the external power source 14 to the modules via the supply pins 6, 7. However, because, in this power supply concept, no measures are taken to screen the dynamic currents drawn from the modules 1 to 4 during operation from the external system, for example components on a circuit board on which the chip 1 is arranged, there is the risk of the chip 1 outputting relatively high electromagnetic interference radiation (EMD) into this environment.

In order to limit this problem of relatively high interference radiation, in the integrated circuit shown in FIGS. 2 and 2A, an appropriate screening measure is taken in the form of capacitive buffer devices. Apart from these capacitive buffers, the circuit in FIGS. 2, 2A corresponds to the circuit in FIGS. 1, 1A described above, for which reason corresponding parts are provided with the same reference numerals and it is not necessary to further describe them. The capacitive buffers are in the form of two capacitors 15, 16 which are implemented as on-chip capacitors and are connected in parallel with the supply tracks 8, 9, specifically using connecting tracks which run parallel to the connecting tracks for the modules 2, 3, 4 and 5. The two capacitive buffers and capacitors 15, 16 are arranged between the pairs of modules 2, 3 and 4, 5 and are represented in the equivalent circuit diagram according to FIG. 2A by a single capacitor C which is arranged between the pairs of modules A, B downstream of the (double) module A and upstream of the (double) module B. Owing to this assignment of the capacitor C, the resistors R2, R4 in the supply lines 8, 9 in FIG. 1A are represented in a split form as resistors R2A, R2b and R4a, R4b.

In the design of that chip power supply it was assumed that the capacitive buffers prevent interference currents owing to high switching currents for the modules being extracted into the external system. However, it has become apparent that that interference suppression measure applies essentially exclusively to the modules 4 and 5, or B, upstream of which the capacitors 15, 16 are arranged with respect to the supply pins 6, 7, while there is virtually no buffering by the capacitors 15, 16 for the modules 2 and 3 which are arranged upstream of the capacitors 15, 16 with respect to the supply pins 6, 7, i.e. these modules 2, 3 continue to be directly supplied with current without buffering from the supply pins 6, 7 so that their switching currents continue to generate a relatively high level of electromagnetic interference radiation for the environment. These facts can, in other words, also be represented as follows: in the capacitors 15, 16 an electrical charge is stored which can be accessed by the downstream modules 4, 5 in the case of switching currents so that these modules draw current from the capacitors 15, 16 indirectly or in a buffered fashion and not directly from the supply pins 6, 7, from which current charging current flows on into the capacitors 15, 16. However, there is no correspondingly buffered power source available for the modules 2, 4 which directly follow the supply pins 6, 7, for which reason, in the case of switching currents the latter draw charge directly from the supply pins 6, 7, and thus the power source 14. At any rate, the buffers in the form of capacitors 15, 16 for the buffered power supply of the modules 2, 3 are not a possibility, for which reason switching current drawn from these modules directly loads the d.c. source 14 and thus generates interference radiation.

SUMMARY OF THE INVENTION

It is accordingly an object of the invention to provide an integrated circuit on a chip, which overcomes the above-mentioned disadvantages of the heretofore-known devices and methods of this general type and which has a common power supply of the type mentioned above that is optimized in terms of electromagnetic interference radiation, i.e., it has an EMC-optimized electric power supply.

With the foregoing and other objects in view there is provided, in accordance with the invention, an integrated circuit formed on a chip, comprising:

a plurality of modules;
common power supply terminals connected to the modules; and
capacitive buffers for buffering the power supply associated with each one of the modules, the capacitive buffers having a capacitance set to cover a dynamic current demand of the modules.

In accordance with an added feature of the invention, power supply tracks extend from the power supply terminals to supply terminals of the modules, and the capacitive buffers are integrated into the power supply tracks.

In accordance with an advantageous feature of the invention, the modules are centrally disposed on the chip, and the power supply tracks extend around the modules in an annular shape.

In accordance with another feature of the invention, the capacitive buffers are formed underneath the power supply tracks.

In other words, the invention provides for complete separation in terms of impedance between the on-chip power supply system and the external power supply. This is achieved in that current is fed via capacitive buffers to each module of the integrated circuit formed on the chip and not only to selected modules as in the case of the prior art explained at the beginning. In other words, each module of the integrated circuit draws its current from a capacitive buffers lying upstream so that the externally supplied current serves exclusively to top up the capacitive buffers with electrical charge. This ensures that electromagnetic interference radiation (EMC, electromagnetic compatibility) is at least considerably reduced in comparison to the prior art because dynamic currents which are drawn on the chip are kept away from the external system and only one more or less uniform recharging current is fed into the power supply system on the chip from the external power supply. In tests it has been possible to determine that interference radiation in the circuit configured according to the invention can be reduced by a factor of 10 in comparison to the system shown in FIGS. 2 and 2A and described in the introductory text above.

The on-chip power supply system according to the invention is advantageously embodied as a ring supply concept with power supply tracks running in an annular shape around the modules arranged at the center of the chip and with capacitive buffers arranged in a neutral fashion in terms of area under these power supply tracks. The capacity of the capacitive buffers is selected in such a way that they are sufficient to at least substantially cover the dynamic power demand of the modules of the integrated circuit.

In accordance with a concomitant feature of the invention, the capacitive buffers are formed as on-chip capacitors.

Other features which are considered as characteristic for the invention are set forth in the appended claims.

Although the invention is illustrated and described herein as embodied in an EMC-optimized on-chip electric power supply, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagram of a first embodiment of an integrated circuit formed on a chip without capacitive buffers, according to the prior art;

FIG. 1A is an equivalent circuit diagram of the integrated circuit of FIG. 1;

FIG. 2 is a diagram of an embodiment of an integrated circuit formed on a chip with a capacitive buffer that is partially effective for selected modules, according to the prior art;

FIG. 2A is an equivalent circuit diagram of the integrated circuit from FIG. 2;

FIG. 3 is a diagram of an integrated circuit formed on a chip according to the invention, with an on-chip power supply system for all the modules that is separated in terms of impedance from an external power supply system; and FIG. 3a is an equivalent circuit diagram of the integrated circuit of FIG. 3.

DESCRIPTION OF THE PREFERRED EMBODIMENTS

FIGS. 1, 1A and FIGS. 2, 2A are explained in the introduction relating to the prior art. The invention will now be explained in more detail by means of FIGS. 3 and 3a with reference to FIGS. 2, 2A, specifically using the same reference numerals for identical components.

According to FIG. 3, an integrated circuit with modules 2, 3, 4, 5 is formed on a chip 1. The four modules 2, 3, 4, 5 are arranged one next to the other in the center of the chip 1, forming a square with their enveloping outline. The power supply tracks associated with the circuit are shown in FIG. 3 by black regions and the capacitive buffers provided according to the invention are arranged in a neutral fashion in terms of area under the power supply tracks and shown by hatching in FIG. 3. Accordingly, the power supply tracks and the capacitive buffers each form a ring system, for which reason a ring current supply concept can be applied to the power supply concept according to the invention.

As is apparent from the equivalent circuit diagram of the circuit according to FIG. 3 and FIG. 3a, each of the pairs of modules 2 and 3, or A, and 4 and 5, or B, draws its dynamic power demand from capacitive buffers or capacitors C1 and C2 which are dimensioned in such a way that they are capable of making available the required dynamic switching currents so that only charging current for the capacitors C1 and C2 is supplied to the chip 1 by the external power source 14 via the power supply pins 6, 7. This power supply concept ensures that the circuit which is implemented on the chip 1 essentially generates no, or only very little, electromagnetic radiation for the surroundings in comparison to the prior art. The core of this configuration of the circuit implemented on a chip is accordingly the provision of the electrical charge, required for the dynamic switching currents of the modules, on the chip 1 at least substantially to the same required extent while minimizing interference radiation (EMC).

I claim:

1. An integrated circuit formed on a chip, comprising:
a plurality of modules disposed on the chip;
common power supply terminals connected to said modules;

power supply tracks extending from said power supply terminals to supply terminals of said modules, and extending around said modules in an annular shape; and capacitive buffers for buffering the power supply associated with each one of said modules, said capacitive buffers being integrated into said power supply tracks and having a capacitance set to cover a dynamic current demand of said modules.

2. The circuit according to claim 1, wherein said capacitive buffers are formed underneath said power supply tracks.

3. The circuit according to claim 1, wherein said capacitive buffers are on-chip capacitors.

4. The circuit according to claim 1, wherein said modules are centrally disposed on the chip.

* * * * *